United States Patent
Levy

(10) Patent No.: US 7,280,052 B2
(45) Date of Patent: Oct. 9, 2007

(54) APPARATUS, SYSTEM, AND METHOD OF DATA COMPRESSION

(75) Inventor: Amir Levy, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 11/239,474

(22) Filed: Sep. 30, 2005

(65) Prior Publication Data

US 2007/0085714 A1    Apr. 19, 2007

(51) Int. Cl.
*H03M 7/34*    (2006.01)
(52) U.S. Cl. .......................................... 341/51; 341/50
(58) Field of Classification Search .................. 341/50, 341/51; 710/2, 202, 101; 360/69
See application file for complete search history.

(56) References Cited

U.S. PATENT DOCUMENTS 5,410,671 A * 4/1995 Elgamal et al. ............. 711/202
5,455,576 A * 10/1995 Clark et al. .................... 341/50
5,629,695 A * 5/1997 Watts et al. .................... 341/51
6,012,062 A * 1/2000 Jagadish et al. ............. 707/101
6,493,166 B1 * 12/2002 Takayama ..................... 360/69
6,748,457 B2 * 6/2004 Fallon et al. ................... 710/2

* cited by examiner

*Primary Examiner*—Jean Bruner Jeanglaude
(74) *Attorney, Agent, or Firm*—Pearl Cohen Zedek Latzer, LLP

(57)    ABSTRACT

A method and system of compressing an input data item such as, e.g., a cache line of machine-executable code, by selecting a partition of the data item into subsequences that appear as words in a dictionary of a probability-based encoding scheme, such that the encoding of the subsequences produces a compressed representation of the data according to a desired efficiency parameter, e.g., minimized length. The method may implement an algorithm to identify one or more possible compressed representations of the input data item and to select a more efficient compressed representation.

22 Claims, 3 Drawing Sheets

APPARATUS, SYSTEM, AND METHOD OF DATA COMPRESSION

BACKGROUND

Conventional lossless data compression methods use algorithms to compress an original data item such as, e.g., machine executable code, having a given length measured in bits, into a compressed representation of the data, which may include less than the original amount of bits. The compressed representation allows reconstruction of the original data item with no loss of information.

Some lossless data compression methods may include a probability-based encoding scheme, e.g., Huffman encoding, to encode input data into a unique bit sequence, eg., a binary encoding, in such a way that data subsequences having a higher recurrence probability are associated with a shorter binary encoding. An encoding algorithm may rely on a statistical model of the input data type, which may include, for example, a dictionary having entries that correspond to subsequences, or words, of high recurrence probability.

Reducing the size of the compressed code, i.e., improving the compression ratio, may allow more data to be stored in a limited memory space, resulting in reduced storage costs and/or faster execution performance times.

BRIEF DESCRIPTION OF THE DRAWINGS

The subject matter regarded as the invention is particularly pointed out and distinctly claimed in the concluding portion of the specification. The invention however both as to organization and method of operation, together with objects, features, and advantages thereof, may best be understood with reference to the following detailed description when read with the accompanied drawings in which:

Figure 1:
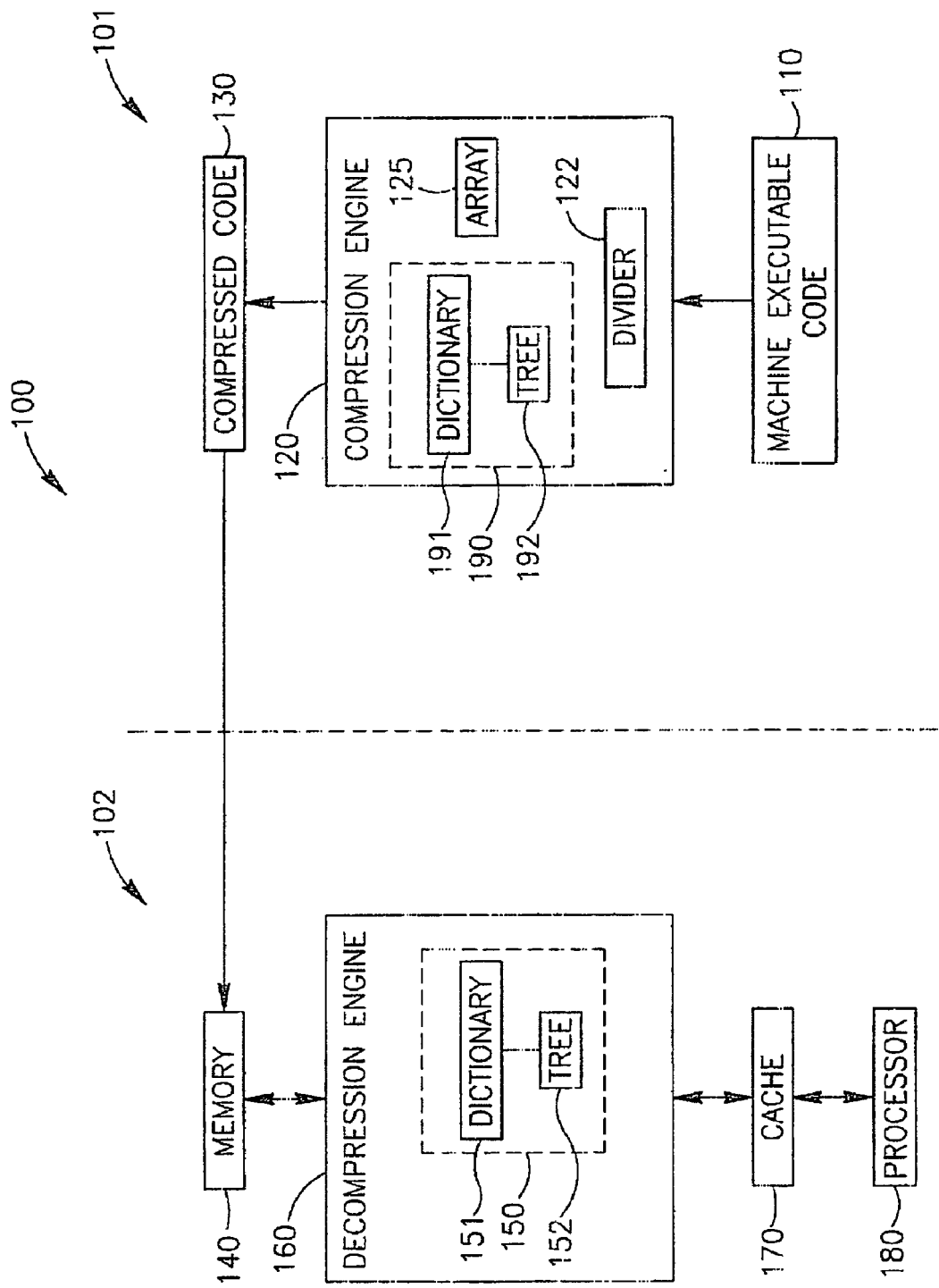
FIG. 1 is a simplified block diagram of a part of a system capable of performing data compression and decompression according to a demonstrative embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, numerous specific details are set forth in order to provide a thorough understanding of the invention. However, it will be understood by those of ordinary skill in the art that the present invention may be practiced without these specific details. In other instances, well-known methods, procedures, components, and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission, or display devices. In addition, the term "plurality" may be used throughout the specification to describe two or more components, devices, elements, parameters, and the like.

It should be appreciated that according to some embodiments of the present invention, the method described below, may be implemented in machine-executable instructions. These instructions may be used to cause a general-purpose or special-purpose processor that is programmed with the instructions to perform the operations described. Alternatively, the operations may be performed by specific hardware that may contain hardwired logic for performing the operations, or by any combination of programmed computer components and custom hardware components.

The term "code" as used herein may refer to an aggregation of machine executable instructions such as, for example, those found in a compiled binary file of a computer program. The phrase "cache line" as used herein may refer to a predefined length of code, e g., 128 bytes, that is loaded into a memory cache for execution by a central processing unit (CPU).

Some demonstrative embodiments of the invention include a method and/or system of compressing an input data item such as, e.g., a cache line of machine-executable code, by selecting a partition of the data item into subsequences that appear as words in a dictionary of a probability-based encoding scheme, such that the encoding of the subsequences produces a compressed representation of the data according to a desired efficiency parameter, e g., minimized length, as described in detail below. In accordance with demonstrative embodiments of the invention, the method may implement an algorithm to identify one or more possible compressed representations of the input data item and to select a mole efficient compressed representation, as described in detail below.

Reference is made to FIG. 1, which schematically illustrates part of a system 100 to perform data compression and decompression according to a demonstrative embodiment of the invention. Although the present invention is not limited in this respect, system 100 may include a compression subsystem 101 to convert, e.g., machine executable code, into compressed code and an execution subsystem 102 to store, decompress, and execute the compressed code. Although the invention is not limited in this respect, depicted elements of compression subsystem 101 may be implemented by software components and depicted execution elements of subsystem 102 may be implemented by hardware elements. Any other suitable combination of hardware and/or software components is also within the scope of embodiments of the invention.

It is appreciated that embodiments of the present invention may be implemented by software, by hardware, by firmware, or by any combination of software, hardware, and/or firmware as may be suitable for specific applications in accordance with specific design requirements. Embodiments of the present invention may include units and sub-units, which may be separate of each other or combined together, in whole or in part, and may be implemented using specific, multi-purpose, or general processors or devices as known in the art. Some embodiments of the present invention may include buffers, registers, storage units and/or memory units, for temporary or long-term storage of data and/or in order to facilitate the operation of a specific embodiment.

In accordance with demonstrative embodiments of the invention, compression subsystem 101 may include a compression engine 120, which may receive an input data item such as machine executable code 110, e.g., a compiled binary file, and produce an output compressed code 130. Although the invention is not limited in this respect, compression engine 120 may include a divider 122 to divide input data item 110 into blocks of predetermined size, e.g., 128 byte cache lines, to be compressed separately. In accordance with different demonstrative embodiments of the invention, divide 122 may be implemented as a component of compression engine 120 or as a separate component within compression subsystem 101.

Although the invention is not limited in this respect, compression engine 120 may execute a probability-based compression scheme 190. For example, the execution of compression scheme 190 may be performed by any suitable multi-purpose, special-purpose, or general processors or devices as known in the art, and may be facilitated by any suitable memory units for temporary or long-term storage of data, as known in the art. In accordance with some demonstrative embodiments of the invention, compression scheme 190 may include a compression dictionary 191, having as entries words corresponding to subsequences with a relatively high recurrence probability in data item 110, and an associated encoding tree 192 to provide an encoding of each dictionary entry such that a word with a relatively high recurrence probability may be associated with an encoding of relatively short length. For example, compression scheme 190 may correspond to, e.g., Huffman encoding or Lempel-Ziv-Welch (LZW) compression, or any other suitable scheme that is known in the art. In accordance with some demonstrative embodiments of the invention, dictionary 191 and tree 192 may be suitable for compression of a plurality of input data items containing machine executable code. In accordance with other demonstrative embodiments of the invention, compression engine 120 may be able to update the probability-based entries of compression dictionary 191 and encoding tree 192 according to the specific recurrence frequency of subsequences in data item 110. Although the invention is not limited in in this respect, dictionary 191 and tree 192 may be implemented using software, hardware, and/or any suitable combination of software and hardware that is known in the art.

According to demonstrative embodiments of the invention, compression engine 120 may include a rewritable data storage structure 125, e g., a compression array having a desired amount of cells corresponding to the size of the input data item, e g., a 128 byte cache line. Compression array 125 may store at least one possible compressed representation of input data item 110 and allow selection of a representation according to a desired compression efficiency parameter. For example, a compressed representation may include an encoding, e g., according to encoding tree 192, of one or mole subsequences of data item 110, which correspond to words that may be looked up, e g., in dictionary 191. Different possible compressed representations may correspond to different partitions of data item 110 into subsequences identified in dictionary 191. In accordance with demonstrative embodiments of the invention, compression engine 120 may implement a compression algorithm that stores a first match representation of the data item in array 125 and continues to search for a better match by identifying an additional possible representation, comparing it with the stored representation, and selecting the better match according to a compression efficiency parameter. A method which may be performed by compression engine 120 according to a demonstrative embodiment of the invention is explained in detail below with reference to FIG. 2.

According to some demonstrative embodiments of the invention, execution subsystem 102 may include a memory device 140, e.g., flash memory, random access memory (RAM), read only memory (ROM), electrically erasable programmable read only memory (EEPROM), or any other suitable memory as is known in the art, to store the compressed code 130 produced by compression engine 120; a decompression engine 160 to reconstruct the original data item e.g., machine executable code 110, from the compressed code stored in memory 140; a cache memory 170 to receive the decompressed code from decompression engine 160, e.g., in cache-line sized blocks, and a processor 180, e.g., a CPU to execute the code from cache memory 170. The size of the cache lines may depend on the hardware architecture of execution subsystem 102.

In accordance with demonstrative embodiments of the invention, decompression engine 160 may execute a decompression scheme 150 corresponding to the compression scheme 190 used by compression engine 120. Although the invention is not limited in this respect, decompression scheme 150 may include, e.g., circuits with embedded logic to implement a decompression dictionary 151 and a decoding tree 152, corresponding to the compression dictionary 191 and the encoding tree 192 of compression scheme 190, respectively. Decompression engine 160 may decompress compressed code 130 using techniques known in the art, e.g., using decompression dictionary 151 and decoding tree 152.

Although the invention is not limited in this respect, components of execution subsystem may be implemented as components of a suitable hardware device such as, e.g., a network interface card or any other hardware device as is known in the art that may execute machine executable code 110.

Figure 2:
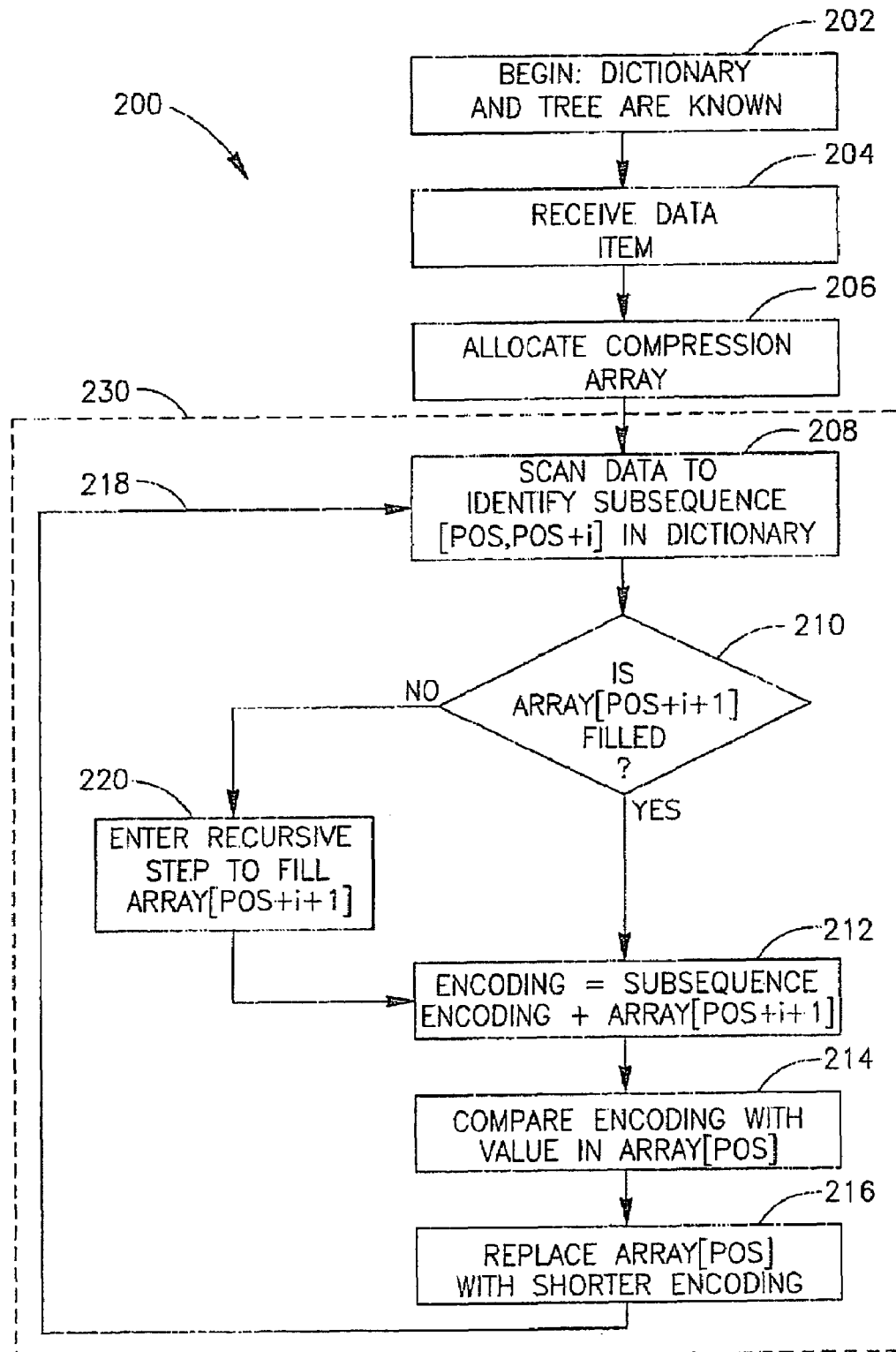
FIG. 2 is a schematic flowchart of a data compression method according to a demonstrative embodiment of the invention.
Figure 3:
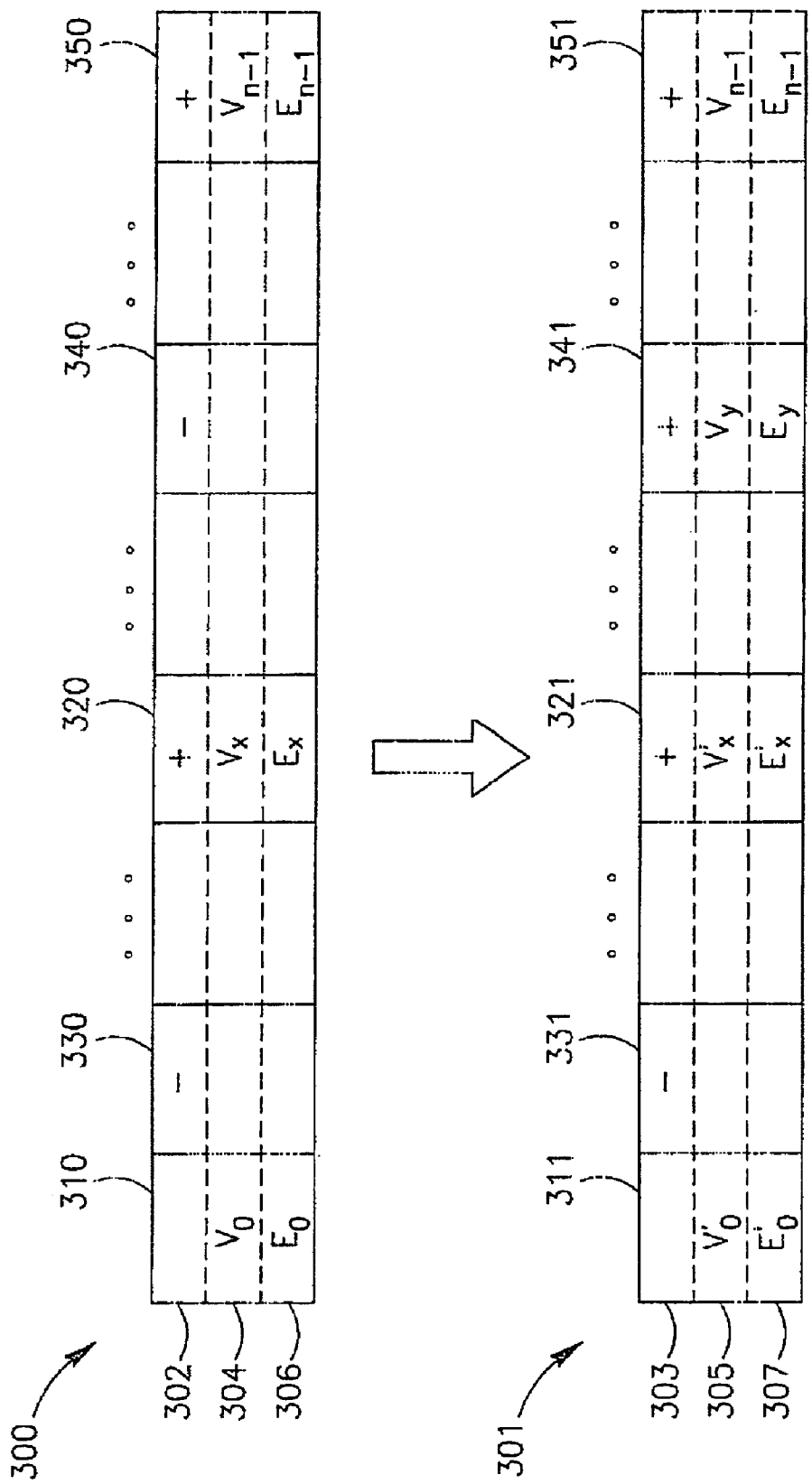
FIG. 3 is a schematic depiction of storing and replacing values in a compression array as part of a method of data compression according to a demonstrative embodiment of the invention.

Reference is made to FIG. 2 which is a schematic flow-chart of a method 200 of improved code compression according to a demonstrative embodiment of the invention. Reference is also made to FIG. 3, which is a schematic depiction of storing and replacing values in a compression array as part of a method of data compression according to a demonstrative embodiment of the invention, e.g., method 200 Although the invention is not limited in this respect, method 200 may be performed by compression engine 120 of FIG. 1, e.g., using array 125.

As indicated at block 202, method 200 may rely on a dictionary and tree of a probability-based encoding scheme such as, e.g., compression scheme 190 of FIG. 1. For example, the compression dictionary, e.g., dictionary 191, may be used to look up subsequences of an input data item to check whether the subsequences appear as a word in the dictionary. The encoding tree e.g., tree 192, may be used to encode the subsequence and produce a compressed representation of the input data item.

As indicated at block 204, method 200 may receive an input data item to be compressed, e.g., a block of data from divider 122 of FIG. 1. In accordance with some demonstrative embodiments of the invention, as indicated at block 206, method 200 may allocate a compression array, e.g., array 125 of FIG. 1, with a plurality of cells corresponding to the size of the data item to be compressed, e.g., the number of bits in a cache line. For example, FIG. 3 depicts a compression array 300 (301) having N cells indexed 0 to N-1.

According to demonstrative embodiments of the invention, method 200 may be able to select a partition of the data item into subsequences that appeal as words in the dictionary of the probability-based encoding scheme, such that the encoding of the subsequences, according to the encoding tree, produces a compressed representation of the data having a desired efficiency parameter value, e.g., minimized length. For example, as indicated at block 230, method 200 may include a dynamic algorithm, e.g., as described below, to identify one or more possible compressed representations of the input data item and to select a more efficient compressed representation, e.g., a shorter compressed representation of a cache line Although the invention is not limited in this respect, the dynamic algorithm may include a function that receives a position in an input data item, e.g., a cache line, as an input variable and fills the correspondingly indexed cell of the compression array, e.g., cell 320 (321) of array 300 (301). According to demonstrative embodiments of the invention, the cells of the compression array may provide an efficient compressed representation of the remainder subsequence of data beginning at the position of the cell index to the end of the cache line. Thus, the first cell of the array, e.g., cell 310 (311) of array 300 (301), may provide a desired compressed representation of the entire cache line in accordance with some. demonstrative embodiments of the invention, the dynamic algorithm may evaluate representations corresponding to different partitions of the input data item into subsequences identified as words in the compression dictionary and replace a first stored representation with a second possible representation depending on a result of a comparison. For example, a representation corresponding to array 300 may be replaced by a representation corresponding to array 301, as described in more detail below. Depending on the partitioning, some cells of the compression array may remain empty, e.g., cell 331 of array 301.

Although the invention is not limited in this respect, the cells of the compression array may contain values of variables of different data types. For example, compression array 300 (301) may include a Boolean variable vector 302 (303) to store an indication whether a compressed representation for the subsequence of data beginning at the position of the cell index was calculated; an integer variable vector 304 (305), e.g., with values $V_0$ to $V_{N-1}$, to store the length of the compressed representation; and a string variable vector 306 (307), e.g., with values $E_0$ to $E_{N-1}$, to store the encoding of the compressed representation For example, the following is a pseudocode representation of a function, CachePunctuation, to perform a dynamic algorithm of block 230 according to one demonstrative embodiment of the invention:

```
CachePunctuation(Pos)
Begin
  For (i = 0 min(MaxWordLength-1, NumSymbolsRemaining))
  Begin
```

```
    If (substring from Pos to Pos+i exists in dictionary)
    Begin
      If (Array[Pos+i+1] already calculated)
        BinaryLength = substring binary length + length of
                       Array[Pos+i+1]
      Else
        BinaryLength = substring binary length + length of
                       Punctuation(Pos+i+1)
      End
      If (length of Array[Pos] > BinaryLength)
      Begin
        Array[Pos] = BinaryCode
      End
    End
  End
End
```
[Algorithm 1]

Referring again to FIG. 2, method 200 may include scanning the input data line and comparing to the encoding dictionary until a subsequence is identified as a word in the dictionary, as indicated at block 208. For example, the algorithm of block 230 may begin at position Pos and iterate a counter i to look up the subsequence [Pos, Pos+i]. In accordance with some demonstrative embodiments of the invention, the counter i may have an upper limit such that a subsequence under evaluation will not exceed the maximum length of a dictionary entry or the end of the input data line. It is appreciated that identifying a subsequence in the dictionary may correspond to finding an encoding of that subsequence according to the associated encoding tree of the compression scheme, e.g. tree 192 of FIG. 1.

According to some demonstrative embodiments of the invention, as indicated at block 210, method 200 may include checking whether a compressed representation for the remainder subsequence beginning at Pos+i+1 is calculated in the corresponding cell of the compression array, e.g., by checking the value of the Boolean variable stored in, e.g., cell 340 of array 300. In accordance with some demonstrative embodiments of the invention, if the remainder is not calculated, method 200 may include a recursive step to fill the cell Array[Pos+i+1], e.g., cell 341 of array 301, as indicated at block 220. For example, as discussed above, method 200 may implement a dynamic algorithmn, e.g., as is known in the art, with a recursive function that receives a position in the cache line as an input. Although the invention is not limited in this respect, method 200 may call the function recursively with Pos+i+1 as an input argument instead of Pos until the data sequence is handled. If there is no remainder subsequence, e.g., if the entire input data sequence is handled, method 200 may include storing the binary encoding value of the identified subsequence in the compression array, e.g., value $E_{N-1}$ in cell 350 (351) of array 300 (301).

Although the invention is not limited in this respect. as indicated at block 212, method 200 may include adding, e.g., concatenating, the binary encoding of the subsequence [Pos, Pos+i], e.g., value $E_x$ stored in cell 320, to the binary encoding calculated in cell Array[Pos+i+1], e.g., value $E_y$, stored in cell 341 to produce a compressed representation of the input data line. As indicated at block 214, method 200 may include comparing a value of a compression efficiency parameter, e.g., binary encoding length, of the compressed representation from block 212 with at least one compression efficiency parameter value stored in Array[Pos], e.g., value $V_x$ of cell 320, to determine, e.g., which representation is shorter. According to some demonstrative embodiments of the invention, if cell Array[Pos] is not yet calculated as indicated by the Boolean value of vector 302, it may be considered to have a binary encoding of theoretically infinite length. For example, vector 304 may be initialized with the maximum value of an unsigned integer, e.g., $2^{32}-1$. As indicated at block 216, method 200 may include replacing the compressed representation in cell Array[Pos], value $E_x$ in cell 320, with the shorter compressed representation calculated at block 212, e.g., $E_x'$ stored in cell 321.

According to some demonstrative embodiments of the invention, as indicated by loop arrow 218, the dynamic algorithm of block 230 may continue to scan for an additional subsequence beginning at position Pos that corresponds to a word in the dictionary. For example, the algorithm may find a substring [Pos, Pos+j], where j is greater than i. Thus, in accordance with demonstrative embodiments of the invention, method 200 may identify compressed representations corresponding to more than one possible partition of the input data item.

Although the invention is not limited in this respect, the following Algorithm 2 may represent a portion of a computer program, written in the C# programming language, which may be performed, for example, by compression engine 120 of FIG. 1 according to another demonstrative embodiment of the invention. For example, Algorithm 2 may be used to execute a function denoted CachePunctuation, which may receive input parameters indicating a position in a compression array, a start position in a data sequence, e.g., a cache line, an end position of the data sequence, a reference pointer to a cell in the compression array to store results, and a Boolean variable, e.g., newTree to indicate whether a new encoding tree is to be built. In accordance with demonstrative embodiments of the invention, if newTree is false, the function may perform steps analogous to those of the pseudocode Algorithm 1 described above with reference to FIG. 2.

```
private void CachePunctuation(int pos, int start, int end, ref Cell[ ]
res, bool newTree)
{
    string key = "";
    for (int i = pos + 1;
        (start < end) && (key.Length < CodeMember.maxLength);
        i++, start++)
    {
        key += (char)stream[start];
        if (dictionary.ContainsKey(key))
        {
            CodeMember member = (CodeMember)dictionary[key];
            if (i < cacheLine)
            {
                if (newTree)
                {
                    if (res[i] .numWords == uint MaxValue)
                        CachePunctuation(i, start + 1, end, ref
                            res, newTree);
                    uint numWords = res[i].numWords + 1;
                    uint freq = res[i].freq + member.frequency;
                    if ((numWords < res[pos] numWords) ||
                        ((numWords == res[pos] numWords) &&
                        (res[pos] freq < freq)))
                    {
                        res[pos].numWords = numWords;
                        res[pos] freq = freq;
                        res[pos].member = member;
                    }
                }
                else
                {
                    if (res[i].freq == uint MaxValue)
                        CachePunctuation(i, start + 1, end, ref
```

-continued

```
                            res, newTree);
                    uint freq = res[i].freq +
                        member.height;
                    if (res[pos].freq > freq)
                    {
                        res[pos] freq = freq;
                        res[pos] member = member;
                    }
                }
            }
            else
            {
                res[pos].num\Words = 1;
                res[pos] freq = newTree ? member.frequency :
                    member.height;
                res[pos].member = member;
            }
        }
    }
}
```
[Algorithm 2]

In accordance with demonstrative embodiments of the invention, the recursive algorithms described above may have a linear runtime, as indicated, for example, by the following equation:

$$T(N) \le \sum_{i=1}^{L} T(N-i) + O(1) \le L^N N = O(N) \quad (1)$$

where L is a constant representing the maximum length of a dictionary entry

Although the invention is not limited in this respect, the operation of the dynamic algorithm described above may be represented, for example, by the following mathematical formula:

$$\forall_i \text{Array}[i] = \mathop{\text{Max}}_{j=0}^{L-1}(B[i, i+j] + \text{Array}[i+j+1]) \quad (2)$$

where L may refer to a maximum dictionary entry length,
Array may refer to a data structure with a plurality of cells corresponding to a data item to be compressed, and
B[x,y] may refer to a binary encoding of a subsequence located from position x to position y While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A method comprising:
    storing in a compression array a first possible representation of an input data item;
    comparing a first value of a compression efficiency parameter relating to one or more subsequences of said first representation, with a second value of said compression efficiency parameter relating to one or more subsequences of a second possible representation of said input data item; and replacing in said compression with said one or more subsequences of said first possible representation with said one or more subsequences of the second possible representation if said comparison indicates that said second possible representation is more efficient for compression of said input data item;
wherein the first and second possible representations correspond to first and second partitions, respectively, of said input data item into subsequences looked up in a compression dictionary.

2. The method of claim 1, comprising compressing said input data item based on the content of said compression array.

3. The method of claim 1, comprising looking up said one or more subsequences of said input data item in said compression dictionary to provide said partitions of said input data item.

4. The method of claim 3, comprising encoding said one Or more subsequences of said first and second partitions, using an encoding tree associated with said compression dictionary, to provide said first and second representations, respectively.

5. The method of claim 1, wherein comparing said first aid second values comprises comparing a value relating to the length of an encoding of said one or more subsequences of said first representation and a value relating to the length of an encoding of said one or more subsequences of said second representation, respectively.

6. The method of claim 5, wherein replacing in said compression array comprises replacing if said second compression efficiency parameter value corresponds to a shorter encoding length than said first compression efficiency parameter value.

7. An apparatus comprising:
a compression engine to store a first possible representation of an input data item corresponding to a first partition of said input data item into one or more subsequences of said input data item, to compare a first value of a compression efficiency parameter relating to said first representation with a second value of said compression efficiency parameter relating to one or more subsequences of a second possible representation of said input data item, and to replace said one or more subsequences of said first possible representation with said one or more subsequences of the second possible representation if said comparison indicates that said second possible representation is more efficient for compression of said input data item.

8. The apparatus of claim 7, wherein said compression engine comprises a compression array having a plurality of cells to store said compression efficiency parameter values relating to said first and second representations.

9. The apparatus of claim 8, wherein said compression engine is to compress said input data item based on the content of said compression array.

10. The apparatus of claim 7, wherein said compression engine comprises a compression dictionary having entries corresponding to a plurality of subsequences of said input data item having a high recurrence probability.

11. The apparatus of claim 7, wherein said compression engine comprises an encoding tree associated with said compression dictionary to provide an encoding of said dictionary entries such that a subsequence with a relatively high recurrence probability may be associated with an encoding of relatively short length.

12. The apparatus of claim 7, wherein said compression engine is to replace said one or more subsequences if said second compression efficiency parameter value corresponds to a shorter encoding length than said first compression efficiency parameter value.

13. A system comprising:
a memory having stored thereon at least a compression dictionary having entries corresponding to a plurality of subsequences of an input data item having a high recurrence probability; and
a compression engine to store a first possible representation of an input data item corresponding to a first partition of said input data item into one or more subsequences of said input data item looked up in said encoding dictionary, to compare a first value of a compression efficiency parameter relating to said first representation with a second value of said compression efficiency parameter relating to one or more subsequences of a second possible representation of said input data item, and to replace said one or more subsequences of said first possible representation with said one or more subsequences of the second possible representation if said comparison indicates that said second possible representation is more efficient for compression of said input data item.

14. The system of claim 13, wherein said memory is to further store an encoding tree associated with said compression dictionary to provide an encoding of said dictionary entries such that a subsequence with a relatively high recurrence probability may be associated with an encoding of relatively short length.

15. The system of claim 13, wherein said compression engine is to replace said one or more subsequences if said second compression efficiency parameter value corresponds to a shorter encoding length than said first compression efficiency parameter value.

16. The system of claim 13, wherein said compression engine is to produce a compressed version of said input data item based on the content of said compression array, to produce a compressed version of said input data item.

17. The system of claim 16, comprising a memory to store said compressed version of said input data item.

18. The system of claim 16, comprising a decompression engine including a decompression dictionary having entries corresponding to the entries of said compression dictionary, wherein said decompression engine is to decompress said compressed version using said decompression dictionary.

19. The system of claim 18, wherein said decompression engine comprises a decoding tree associated with said decompression dictionary, to provide a decoding of said compressed version into one or more subsequences corresponding to said decompression dictionary entries.

20. A machine-readable medium having stored thereon data compressed by:
storing in a compression array a first possible compressed representation of an input data item;
comparing a first value of a compression efficiency parameter relating to one or more subsequences of said first representation, with a second value of said compression efficiency parameter relating to one or more subsequences of a second possible compressed representation of said input data item; and
replacing in said compression array said one or more subsequences of said first possible representation with said one or more subsequences of the second possible representation if said comparison indicates that said second possible representation is more efficient for compression of said input data item, wherein the first and second possible compressed representations correspond to first and second partitions, respectively, of said input data item into subsequences looked up in a compression dictionary.

21. The machine-readable medium of claim 20 having further stored thereon a decompression dictionary having entries corresponding to the entries of said compression dictionary, said decompression dictionary adapted to be used by a decompression engine to decompress said compressed data.

22. The machine-readable medium of claim 21 having further stored thereon a decoding tree associated with said decompression dictionary, to provide a decoding of said compressed representation into one or mote subsequences corresponding to said decompression dictionary entries.

* * * * *